United States Patent [19]

Fried

[11] Patent Number: 4,626,798
[45] Date of Patent: Dec. 2, 1986

[54] PHASE-LOCK LOOP INCLUDING INTEGRATED CIRCUIT VOLTAGE CONTROLLED OSCILLATOR

[75] Inventor: Jeffrey A. Fried, Lexington, Mass.

[73] Assignee: GTE Laboratories Incorporated, Waltham, Mass.

[21] Appl. No.: 807,496

[22] Filed: Dec. 11, 1985

[51] Int. Cl.$^4$ .................... H03L 7/06; H03B 28/00
[52] U.S. Cl. .................... 331/1 A; 331/57; 331/177 R
[58] Field of Search .................... 331/1 A, 8, 17, 27, 331/57, 108 R, 177 R; 328/133, 134; 307/516

[56] References Cited

U.S. PATENT DOCUMENTS

| | | | |
|---|---|---|---|
| 3,428,913 | 2/1969 | Pechoucek | 331/57 |
| 4,072,910 | 2/1978 | Dingwall et al. | 331/57 |
| 4,079,338 | 3/1978 | Kronlage | 331/57 |
| 4,105,950 | 8/1978 | Dingwall | 331/57 |
| 4,458,165 | 7/1984 | Jackson | 331/57 X |
| 4,517,532 | 5/1985 | Neidorff | 331/57 |

Primary Examiner—Eugene R. LaRoche
Assistant Examiner—D. C. Mis
Attorney, Agent, or Firm—Hamilton, Brook, Smith & Reynolds

[57] ABSTRACT

A voltage controlled oscillator (VCO) is described which comprises a plurality of inverter stages of odd number connected in a ring with the output of each stage connected to the input of the next stage via a voltage controlled impedance provided by the transconductance of pass transistors. In one embodiment, this VCO is incorporated into a Phase-Lock Loop circuit, in which the gates of the pass transistors are connected to a control circuit which provides a variable biasing voltage to the gates inresponse to speed-up or slow-down signals provided by a phase detector. The bias on the gates adjusts the frequency of the voltage controlled oscillator, in accordance with the speed-up or slow-down signal. The phase detector is coupled to a stream of input data pulses and to a reference train of clock pulses provided by the voltage controlled oscillator. The phase detector determines whether the frequency of the clock pulses are faster or slower than the frequency of the data pulses and produces either a speed-up signal or a slow-down signal, depending upon the relative speed. These slow-down and speed-up signals are fed to control means responsive to the signals to increase or decrease the bias voltage applied to the gates of the pass transistors.

11 Claims, 4 Drawing Figures

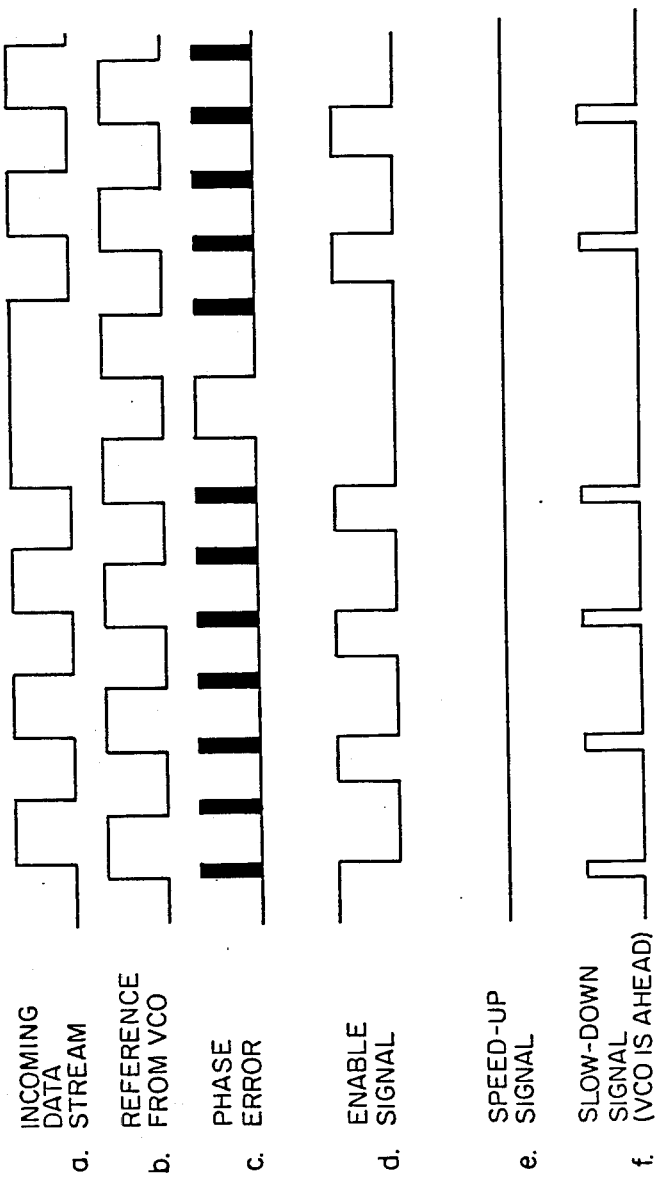

PHASE-LOCK LOOP INCLUDING INTEGRATED CIRCUIT VOLTAGE CONTROLLED OSCILLATOR

DESCRIPTION

1. Technical Field

This invention is in the field of electronic oscillators and, specifically, voltage controlled oscillators formed by integrated semiconductor technology, for use in telecommunications, control systems, audio and video electronics and the like.

2. Background Art

A voltage controlled oscillator is a device for producing electrical signals which oscillate in amplitude at a frequency which is controlled by a biasing voltage applied to the oscillator device. Such devices have found numerous applications in the electronics field over many years and considerable effort has been expended in improving the performance of such devices.

Current state-of-the-art commercially available VCO's need to be improved in at least three respects, i.e., speed or frequency of operation, circuit size, and tolerance to variation in temperature and process parameters, to meet the more demanding needs of the market place.

VCO's, formed using integrated circuit technology, having a frequency of oscillation of 100 megahertz or greater, are very difficult to produce. As a result, the VCO has become the speed-limiting factor in certain system applications. For example, a common application for VCO's is found in Phase-Lock Loops (PLLs). In a PLL, the VCO provides a reference frequency which is synchronized with an incoming signal by a phase detector which generates a voltage error signal to drive the frequency of the VCO to the frequency of the incoming signal.

Phase-Lock Loops may be in analog form or digital form. Analog Phase-Lock Loops require sensitive VCOs with large linear transistors, and often use external resistors and capacitors. The VCO is usually the speed-limiting factor in such Phase-Lock Loops. Digital Phase-Lock Loops usually avoid the use of VCOs because of the requirement for accurate linear transistors. Instead, Digital Phase-Lock Loops may use a variable clock division scheme, at the cost of accuracy, noise immunity, and integrated circuit area. This clock division scheme is also the frequency limiting portion of the design. For good performance, a digital Phase-Lock Loop normally requires an oscillator operating at approximately 30 times the frequency of the incoming signal, or faster.

SUMMARY OF THE INVENTION

In the apparatus of the present invention, a VCO is formed of N-inverter stages connected in a loop or ring, such that the output of one stage is coupled to the input of the next stage and wherein each stage includes a voltage controlled impedance coupled to a variable voltage source for controlling the time-delay of each stage and wherein N is an odd integer greater than one. Each inverter stage comprises a pair of transistors, preferably CMOS switching transistors, one of which is a p-channel device and the other is an n-channel device. The two are connected together to form an inverter by coupling the drain and gate electrodes of each in series between the positive D.C. voltage supply and ground, with the gate electrodes coupled together and to the input terminal and the drain electrodes coupled to each other and to the output terminal of the inverter.

The frequency of oscillation of the VCO is determined by the time delay through each stage. The voltage controlled impedance for varying the time delay of each stage and thereby regulating the frequency of the oscillation of the ring of inverter stages may be provided, in accordance with the invention, in several ways.

In one embodiment, Metal Oxide Semiconductor (MOS) pass transistors are coupled in series with the inverters of each stage and the transconductance ($g_m$) of the pass transistors varied by applying a biasing voltage to the gate electrodes of the pass transistors. In a second embodiment, a pass transistor is coupled between ground and the n-channel transistor of the inverter. By varying the bias applied to the gate of this pass transistor, the time-delay or transfer characteristic of the inverter stage can be speeded-up or slowed-down to regulate the frequency of oscillation of the overall ring of stages forming the VCO. In a third embodiment, the time-delay of each stage is varied by providing a variable load impedance comprising an MOS pass transistor coupled between the signal path and ground through a capacitive pad. Varying the bias on the gate of the pass transistor changes the time-delay of the stage as in the other embodiments.

There is also included in the apparatus of the invention a specific PLL employing a VCO formed as described above.

As will be explained in more detail in connection with the drawings, the invention allows the construction of very small and very fast voltage controlled oscillators compatible with either analog or digital Phase-Lock Loops. The VCO may be used to build a small integrated trunk interface circuit, for example. The invention makes use of the fact that the transconductance of a MOS transistor scales linearly with the gate bias voltage. Because this transconductance property remains fairly linear, even for very small transistors, minimum size transistors may be used, and this VCO may therefore be built using very little area in VLSI.

Because this VCO has only one level of logic and uses very small impedances between stages, it may be made to operate at very high speed.

Because the VCO is made from transistors formed on the same substrate in close proximity and no external componentry is required, the VCO is very tolerant to variations in temperature and fabrication process parameters.

BRIEF DESCRIPTION OF THE DRAWINGS

FIG. 4 is a similar timing diagram based on the assumption that the frequency of the voltage controlled oscillator is ahead of, i.e., faster, than the frequency of the incoming data stream.

FIG. 5 is a detailed schematic diagram of one stage of the inverter stage of the voltage controlled oscillator in a first embodiment of the invention.

FIG. 6 is a similar detailed schematic of one inverter stage of the voltage controlled oscillator of an alternate embodiment of the invention.

FIG. 7 is a similar detailed schematic of yet another alternate embodiment of the inverter stage of the voltage control oscillator of the invention.

BEST MODE OF CARRYING OUT THE INVENTION

Figure 1:
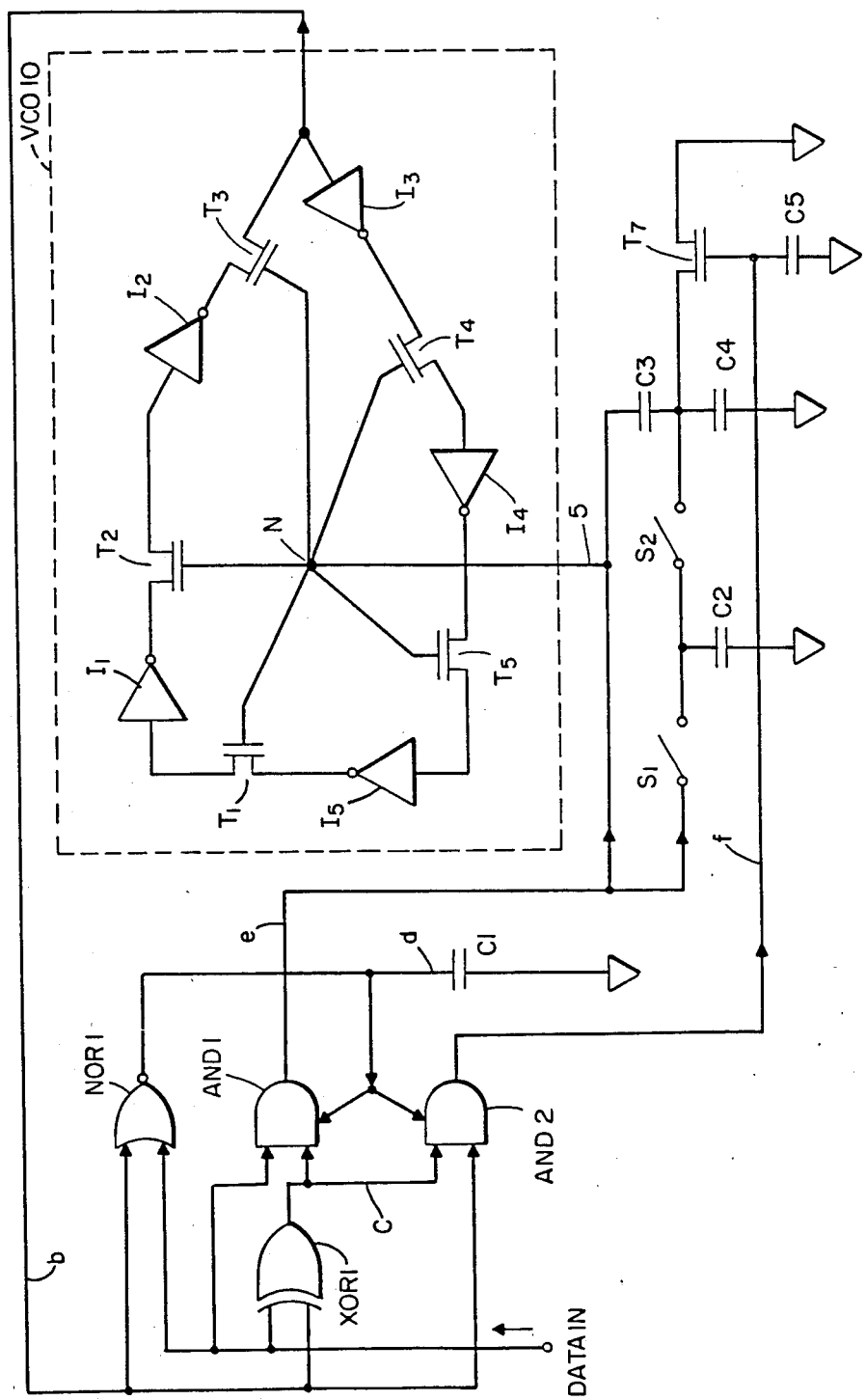
FIG. 1 is a schematic diagram of the voltage controlled oscillator 10 of the invention connected into a Phase-Lock Loop circuit.
Figure 2:
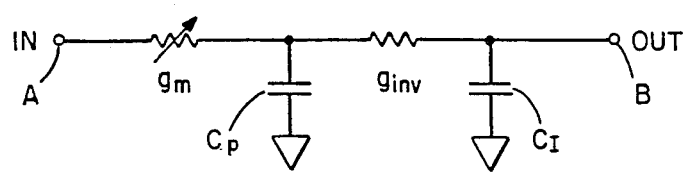
FIG. 2 is a small-signal circuit model of the N-inverter stages forming the voltage controlled oscillator demonstrating the variable delay of each stage.

Referring now to FIGS. 1, 2 and 5, a first embodiment of the invention will be described in connection therewith. The voltage controlled oscillator 10 is shown within the dotted lines and comprises a series of N-number of inverter stages in which the output of one stage is coupled to the input of the next stage and wherein the stages form a closed loop or ring.

Each stage consists of an inverter and a pass transistor. Thus, for example, stage 1 comprises pass transistor T1, coupled in series with inverter I1. In the embodiment of FIG. 1 there are five such stages. Thus, N=5. The small-signal model for each stage is shown in FIG. 2 and the detailed schematic of each stage is shown in FIG. 5 for a first embodiment of the invention. Thus, as shown in FIG. 5, each stage consists of an input terminal A and an output terminal B. A pass transistor T14 has a source electrode coupled to the input terminal A and a drain electrode coupled to the gate electrodes of two MOS transistors, T10 and T12, respectively.

The gate electrode of pass transistor T14 is coupled to a suitable source of biasing voltage. MOS transistor T10 is a p-channel device and MOS transistor T12 is a n-channel device. The transistors T10 and T12 are connected together to form an inverter by coupling the drain and gate electrodes of each in series between the positive D.C. supply voltage V+ and ground with the gate electrodes of each coupled together and to the drain electrode of pass transistor T14.

The drain electrodes of transistors T10 and T12 are also coupled to each other and to the output terminal B of the inverter stage. As shown in FIG. 2, a small-signal delay model for the inverter stage of FIG. 5 is a pair of resistor capacitor circuits coupled in series, with one of the resistors, $g_m$, (representing the transconductance of the pass transistor T14) being variable. The other resistor, $g_{inv}$ represents the transfer function or transconductance of the inverter transistors T10 and T12, while the capacitor $C_p$ represents the parasitic capacitance of the pass transistor T14 and $C_i$ represents the output capacitance of the inverter formed by transistors T10 and T12 plus the parasitic capacitance of the interconnect between stages.

By changing the bias voltage supply to the gate electrode of the pass transistor T14, the time delay of the inverter stage may be adjusted and, hence, the operating frequency of the oscillator may be altered.

The effect of varying the transconductance of the pass transistor T14 by varying the gate bias voltage $V_{gs}$ is shown in Equation 1 below:

$$g_m = \frac{d\mu_e\epsilon}{WL} V_{gs} - V_p \quad \text{(Equation 1)}$$

where
d=diffusion depth
W=gate width
L=gate length
$\mu_e$=mobility of electrons
$\epsilon$=permittivity constant
$V_{gs}$=gate bias voltage
$V_p$=pinch-off voltage
$g_m$=transconductance from "Electronic Principles", Gray & Searle, page 370.

Equation 1 predicts a change in the transconductance which is linear with the applied gate bias voltage. From the circuit model of FIG. 2, it can be seen that variation of transconductance, $g_m$, represented by the resistor labelled $g_m$ in the equivalent circuit, results in the operating frequency of the VCO 10 being roughly linear with respect to the bias voltage within a region surrounding the natural frequency of the overall ring.

In the circuit shown in FIG. 1, all the stages are biased by the same voltage, inasmuch as all of the gates of the pass transistors, T1-T5, are tied to a common node, N, to which the bias voltage from lead 5 is applied. It should be noted that alternatively, each stage may be separately biased, if so desired.

Referring now to FIG. 1, the Phase Lock Loop PLL portion of the schematic of the invention now be described in detail.

A pulse stream of digital data, such as a stream of data transmitted to the receiver in a telecommunication system, is received at an input terminal labelled Data In. This data stream may be of the type shown in curve a of FIG. 3, wherein a series of data pulses of generally squarewave shape is received and provides a data signal in the form of the state, either high and low, of the voltage pulse.

Figure 3:
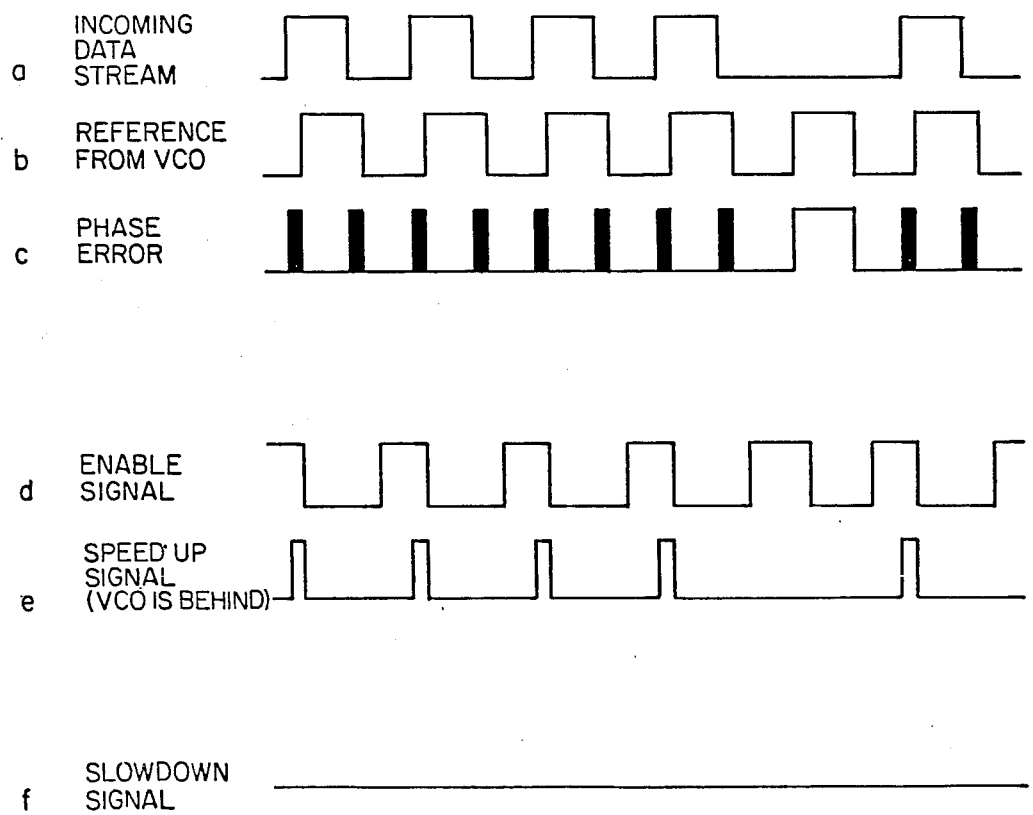
FIG. 3 is a timing diagram in which the voltage amplitude is plotted versus time at various points in the circuit of FIG. 1 under the assumption that the frequency of the voltage controlled oscillator is less than the frequency of the incoming data to the Phase-Lock Loop.

As shown in FIG. 3, this data stream may not always be perfectly symmetrical in nature. At some points in time, the low state may be relatively long in duration or, alternatively, the high state may be of relatively long duration. Furthermore, the waveforms plotted in FIG. 3 are of idealized shape and in actuality, will be curved at the transition points.

The object of the Phase-Lock Loop is to utilize the incoming data stream to generate a biasing voltage which will be applied to the voltage controlled oscillator 10, to drive the voltage controlled frequency into synchronization with the frequency of the incoming data stream pulses. In this manner, the voltage control oscillator pulses may serve as a reference clock to synchronize other portions of the receiving telecommunication system with the clock of the transmitter of the telecommunications data.

In the timing diagram of FIG. 3, curve b represents the voltage output versus time of the voltage controlled oscillator, under the assumption that the frequency of the voltage controlled oscillator pulses is lower in frequency than the data stream. In other words, the voltage controlled oscillator frequency is behind the incoming data stream or out of phase and lagging the phase of the incoming data stream. By coupling the output of the voltage controlled oscillator 10 and the data input stream to the two input terminals of Exclusive-OR GATE 1, as shown in FIG. 3, a phase error signal is generated, as shown in curve c of FIG. 3. This phase error signal represents a series of pulses which occur during the overlap between the start or leading edge of the incoming data stream, curve a, and the leading edge of the reference signal, curve b, from the voltage controlled oscillator, as well as a series of voltage pulses during the overlap of the trailing edge of the incoming stream and the reference signal from the voltage controlled oscillator.

In order to determine if the phase error signal is leading or lagging, an enable signal must be derived. The enable signal is derived by coupling the input data signal and the voltage controlled oscillator signal to NOR GATE 1 to produce the enable signal, as shown in curve d, which is slightly delayed using the capacitive load C1 coupled to ground. Delaying the enable signal permits the logic circuit of AND1 and AND2 to operate during the leading edges of the incoming data stream and reference signal from the voltage controlled oscillator. The output of Exclusive-OR GATE 1, curve c, is coupled to one input terminal of each of AND GATEs 1 and 2. At the same time, the data input signal is coupled to AND GATE 1 and the reference voltage signal from the voltage controlled oscillator is coupled to AND GATE 2. AND GATEs 1 and 2 are enabled by the enable signal shown in curve d; this may be achieved by well-known digital logic or analog circuit means.

As shown in curves e and f of FIG. 3, when the voltage controlled oscillator is lagging, or behind, the frequency of the incoming data stream, an overlap occurs between the falling edge of the enable signal and the leading edge of the incoming data signal or curve a, but no such overlap occurs with respect to the rising edge of the enable signal and the lagging edge of the incoming data signal. Consequently, the speed-up signal, consisting of a train of pulses, as shown in curve e, results from the output of the AND GATE 1 while the slow-down signal, which is the output of the AND GATE 2, remains a low.

The converse occurs when the frequency of the VCO pulse train is ahead of the incoming data stream, as may be observed by comparing FIG. 4 with FIG. 3.

The speed-up signal, which represents a series of pulses from the output of AND GATE 1, is coupled to the control circuitry comprising switches S1 and S2, capacitors C2, C3 and C4 and C5, and transistor T7. The control circuitry operates as follows:

The speed-up signal from AND GATE 1, curve e, is coupled to one side of capacitor 3 and one side of switch S1. Capacitors 3 and 4, coupled with the resistance of the connection between the AND GATE 1 and capacitor 3, form a low-pass filter to derive an analog voltage from the energy of speed-up signal e. The wider the pulses on speed-up signal e, the larger the voltage at node 5. This voltage in turn controls the bias on the gates of pass transistors T1–T5, and hence the frequency of oscillation of VCO 10. Switches S1 and S2 are transistor switches which provide a fine and coarse control over the speed at which the bias on the gates of the pass transistors T1–T5 is adjusted. In the coarse mode, switches S1 and S2 are closed. In this mode, the full amount of the current produced by the speed-up signal of the pulse train of curve e, will charge-up capacitor C4. Capacitor C4 is a relatively large capacitor, while capacitor C3 is comparatively small.

In a typical application utilizing 1.2 micron size CMOS transistors, the VCO would operate in the range of 500–700 megahertz, the capacity of C3 would be about 1.5–2 pico Farad and C4 would be between 20 and 50 times larger, depending on how wide a pulling range is required. Capacitor C2, coupled between switches S1 and S2, acts as a capacitor divider between capacitor C4 and is matched to C4 across process and temperature variations to provide a constant charge for the pull-up range.

In the fine control mode of operation, switches 1 and 2 are both open. Speed-up signal e is coupled to capacitor C3. Since capacitor C3 is small, it will quickly respond to the voltage of speed-up signal e. Thus VCO 10 is comparatively sensitive in the fine control mode.

If the slow-down signal is present, a series of pulses emerges from AND GATE 2, as shown in curve f of FIG. 4. These pulses are coupled from AND GATE 2 to capacitor C5 and the gate of transistor T7. Capacitor C5 is charged-up causing T7 to conduct or increase conduction and slowly leak off the charge on capacitors C4 and C3 via transistor T7. This results in decreasing the voltage to the gates of the pass transistors T1–T5 in the voltage controlled oscillator 10 and thereby lowering the frequency of the oscillator.

This completes the description of the embodiment of the invention as shown in FIG. 1. In summary, the voltage controlled oscillator of FIG. 1 comprises a plurality of inverter stages of odd number connected in a ring with the output of each stage connected to the input of the next stage via a voltage controlled impedance provided by the transconductors of pass transistors T1–T5. The gates of the pass transistors T1–T5 are connected through a control circuit which provides a variable biasing voltage to the gates in response to speed-up or slow-down signals provided by a phase detector. The bias on the gates of transistors T1–T5 adjust the frequency of the voltage controlled oscillator, in accordance with the speed-up or slow-down signal.

The phase detector is coupled to a stream of input data pulses and to a reference train of clock pulses provided by the voltage controlled oscillator. The phase detector determines whether the frequency of the clock pulses are faster or slower than the frequency of the data pulses and produces either a speed-up signal out of AND GATE 1 or a slow-down signal out of AND GATE 2, depending upon the relative speed. These slow-down and speed-up signals are fed to control means responsive to the signals to increase or decrease the bias voltage applied to the gates of the pass transistors T1–T5.

Other alternates to the embodiment shown in FIG. 1 will now be explained in connection with FIG. 6 and FIG. 7.

FIG. 6 is an alternate embodiment showing one stage of the voltage controlled oscillator 10 of FIG. 1 with an input terminal A and an output terminal B. A pair of MOS transistors T10 and T12 form the inverter portion of the stage. MOS transistors T10 and T12 are interconnected as in the first embodiment of FIG. 5. The difference between the two circuits, as shown in FIG. 6, is that instead of connecting the pass transistor T14 to the gates of transistors T10 and T12, a N-channel MOS transistor T16 is coupled between the source terminal of the N-channel transistor T12 and ground and the biasing voltage (bias) from the control circuit is coupled to the gate of this series connected transistor T16.

By varying the bias voltage on transistor T16, the transfer function of the inverter is changed in substantially the same manner as the embodiment of FIG. 5. In effect, the impedance between stages is varied by varying the input impedance of the N-channel transistor T12 in the inverter. The circuit of FIG. 6 has the advantage over that of FIG. 5 in that it is slightly faster and would therefore be more useful for very high speed applications.

Another alternate embodiment is shown in Fig. 7, wherein the inverter circuit comprising transistors T10 and T12 is identical to that of FIGS. 5 and 6. However, in this embodiment, the impedance between stages is varied by varying the load impedance. In this embodiment, pass transistor T18 and capacitor C10 are coupled in series to ground and to the input lead of the inverter. In effect, T18 and C10 comprise a resistance capacitor circuit to ground in which the resistance is the transconductance $g_m$ of the pass transistor T18, which may be varied by varying the bias to the gate of the transistor, thereby changing the input load impedance and, hence, the transfer function or time delay of the inverter stage.

The embodiment of FIG. 7 adds capacitance which would be in the range of 0.1–0.5 pico Farads. Capacitor C10 would be formed from a transistor with its drain and source shorted together and connected to ground, and its gate connected to the drain of transister T18. Therefore, this embodiment would be slower in frequency than that of FIGS. 5 or 6, but it has the advantage that the capacitance C10 dwarfs that of any parasitic capacitance in the transistors and interconnect and, therefore, this circuit would be much more precisely controlled over processing and temperature variations. In addition, transistors T12 and T18 and capacitor C10 are closely matched components, which further improves the tolerance of the circuit to temperature and process variations.

This completes the description of the preferred embodiments of the invention. Since numerous modifications and changes will occur to those skilled in the art, it is not intended that the invention be limited to the exact construction and operation shown and described herein. Accordingly, all suitable modifications and equivalents are intended to fall within the scope of the following claims.

I claim:

1. A voltage controlled oscillator comprising an odd number of inverter stages connected in a ring for producing an oscillating voltage; the output of each stage being connected to the input of the next stage via a voltage controllable impedance.

2. The voltage controlled oscillator of claim 1 wherein the voltage controllable impedance is the transconductance of a transistor.

3. The voltage controlled oscillator of claim 2 wherein each of the inverter stages comprises a pair of MOS devices; each having source, drain and gate electrodes, the source and drain electrodes of which are connected in series between a positive power supply and ground and the gate electrodes of which are coupled together.

4. A voltage controlled oscillator comprising N number of transistor inverter stages, each having input and output terminals and an inverter, and a pass transistor coupled in series between stages, connected in a ring for producing a series of voltage output pulses of predetermined frequency; such frequency being established by a bias voltage applied to the pass transistors, said pass transistors having a gate electrode, said pass transistors controlling the time delay of the inverter stages, and wherein the gate electrode of the pass transistors is adapted to be coupled to a source of variable voltage for providing said bias voltage to vary the transconductance of the pass transistors and thereby vary the time delay of the inverter stages.

5. The oscillator of claim 4 in which the inverter comprises a pair of MOS transistors having gate, drain and source electrodes, one of which transistors is a p-channel device and the other of which is an n-channel device and wherein the drain and gate electrodes of each are coupled in series between a positive D.C. voltage supply and ground and with the gate electrodes of each coupled together and to the input terminal of the inverter stage and the drain electrodes being coupled together and to the output terminal of the inverter stage.

6. The oscillator of claim 5 in which said pass transistors have drain and source electrodes coupled in series with said inverter stages.

7. The oscillator of claim 5 wherein the pass transistors are coupled to the input or output terminal of the inverter stages and through a capacitor to ground.

8. A digital Phase-Lock Loop circuit for providing a reference train of clock pulses synchronized with an incoming stream of data pulses comprising:

(a) a voltage controlled oscillator, having a plurality of inverter stages of odd number connected in a ring with the output of each stage connected to the input of the next stage, and a voltage controlled impedance coupled to said inverter stages and connected to a variable voltage source, for providing said reference train of clock pulses, the frequency of which is controlled by the voltage controlled impedance;

(b) a phase detector adapted to be coupled to said stream of data pulses and to said reference train of clock pulses for determining whether the frequency of the clock pulses is faster or slower than the frequency of the data pulses and for producing a speed-up signal if the clock pulses are slower or a slow-down signal if the clock pulses are faster; and (c) control means responsive to the speed-up or slow-down signals for increasing or decreasing the voltage from said variable voltage source in response thereto.

9. The Phase-Lock Loop circuit of claim 8 wherein the phase detector comprises an Exclusive OR GATE having its input terminals coupled to said reference train of clock pulses and to said incoming stream of data pulses and its output terminal coupled to first and second AND GATES, the other terminal of said AND GATE being coupled to the incoming stream of data pulses and the other terminal of the second AND GATE being coupled to said reference train of clock pulses; and an enable signal formed by coupling the reference train of clock pulses and the incoming stream of data pulses through a NOR GATE and slightly time-delaying the output of said NOR GATE, said enable signal being provided to said first and second AND GATES, whereby an output speed-up signal, comprising a train of pulses, is provided from said first AND GATE in the event the reference train of clock pulses is of lower frequency than the input incoming stream of data pulses and wherein a slow-down signal comprising a train of pulses is provided from the second AND GATE in the event the reference train of clock pulses is operating at a frequency which is greater than the frequency of the incoming stream of data pulses.

10. A Phase-Lock Loop circuit of claim 8 in which the control means comprises a capacitive network coupled between the phase detector and ground and the voltage controlled impedance of the voltage controlled oscillator and, further including a transistor switch which lowers the bias voltage applied to the variable controlled impedance in response to a slow-down signal.

11. A Phase-Lock Loop circuit of claim 8 in which the voltage controlled impedance comprises pass transistors having a gate electrode and the control means comprises a low-pass filter formed of a capacitve network coupled between the phase detector and ground which controls the bias voltage to the gates of the pass transistors.

* * * * *